(12) United States Patent
Sasaki (10) Patent No.: US 8,823,404 B2
(45) Date of Patent: Sep. 2, 2014

(54) EVALUATION DEVICE AND EVALUATION METHOD FOR SUBSTRATE MOUNTING APPARATUS AND EVALUATION SUBSTRATE USED FOR THE SAME

(75) Inventor: Yasuharu Sasaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 292 days.

(21) Appl. No.: 13/014,290

(22) Filed: Jan. 26, 2011

(65) Prior Publication Data

US 2011/0181313 A1 Jul. 28, 2011

Related U.S. Application Data

(60) Provisional application No. 61/282,665, filed on Mar. 15, 2010.

(30) Foreign Application Priority Data

Jan. 27, 2010 (JP) .................................. 2010-015629

(51) Int. Cl.
  *G01R 31/00* (2006.01)
  *G01R 31/327* (2006.01)
  *G21K 5/10* (2006.01)
  *G01J 1/00* (2006.01)

(52) U.S. Cl.
  USPC ................. 324/750.03; 324/750.19; 324/421; 250/442.11; 250/491.1

(58) Field of Classification Search
  USPC ....................................... 324/750.03
  See application file for complete search history.

(56) References Cited

U.S. PATENT DOCUMENTS

| | | | | |
|---|---|---|---|---|
| 5,451,884 A | * | 9/1995 | Sauerland | 324/750.03 |
| 5,638,205 A | * | 6/1997 | Meisel et al. | 359/350 |
| 6,377,437 B1 | * | 4/2002 | Sexton et al. | 361/234 |
| 6,430,022 B2 | * | 8/2002 | Leeser | 361/234 |
| 6,522,054 B2 | * | 2/2003 | Shibata | 313/310 |
| 6,552,308 B2 | * | 4/2003 | Nishimura | 219/497 |
| 6,559,456 B1 | * | 5/2003 | Muraki | 250/491.1 |
| 6,853,953 B2 | * | 2/2005 | Brcka et al. | 702/182 |
| 6,864,488 B2 | * | 3/2005 | Muraki | 250/442.11 |
| 6,940,285 B2 | * | 9/2005 | Montrose et al. | 324/420 |
| 6,940,296 B2 | * | 9/2005 | Yamada | 324/750.19 |
| 7,046,025 B2 | * | 5/2006 | Schneidewind et al. | 324/750.03 |
| 7,129,732 B1 | * | 10/2006 | Knadle | 324/750.03 |
| 7,295,282 B2 | * | 11/2007 | Nanba | 355/30 |
| 7,362,117 B2 | * | 4/2008 | Saito et al. | 324/750.09 |
| 7,506,228 B2 | * | 3/2009 | Pedersen | 714/724 |

(Continued)

FOREIGN PATENT DOCUMENTS

| | | |
|---|---|---|
| JP | 2006-086301 A | 3/2006 |
| JP | 2008-108938 A | 5/2008 |

*Primary Examiner* — Patrick Assouad
*Assistant Examiner* — Christopher McAndrew
(74) *Attorney, Agent, or Firm* — Pearne & Gordon LLP (57) ABSTRACT

There are provided an evaluation device and an evaluation method for a substrate mounting apparatus capable of simply evaluating a temperature control function of the substrate mounting apparatus depending on evaluation conditions or circumstances and an evaluation substrate used for the same. The substrate mounting apparatus holds a target substrate mounted on a mounting surface and controls a temperature of the target substrate. The evaluation device includes an evacuable airtight chamber in which the substrate mounting apparatus is provided; an evaluation substrate which is mounted on the mounting surface instead of the target substrate and includes a self-heating resistance heater; and a temperature measurement unit which measures a temperature of the evaluation substrate.

16 Claims, 11 Drawing Sheets

(56) References Cited

U.S. PATENT DOCUMENTS

| | | | |
|---|---|---|---|
| 7,547,204 B2 * | 6/2009 | Tokita et al. | 425/78 |
| 7,552,022 B2 * | 6/2009 | Romier et al. | 702/99 |
| 7,554,349 B2 * | 6/2009 | Kang et al. | 324/750.03 |
| 7,582,491 B2 * | 9/2009 | Sasaki et al. | 438/14 |
| 7,633,307 B2 * | 12/2009 | Whipple et al. | 324/750.1 |
| 7,659,206 B2 * | 2/2010 | Vepa et al. | 438/694 |
| 7,984,618 B2 * | 7/2011 | Kudo | 62/259.2 |
| 7,999,563 B2 * | 8/2011 | Rumiantsev et al. | 324/750.03 |
| 8,035,405 B2 * | 10/2011 | Lou | 324/750.03 |
| 8,179,152 B2 * | 5/2012 | Booth et al. | 324/713 |
| 8,248,089 B2 * | 8/2012 | Yang et al. | 324/750.03 |
| 8,324,915 B2 * | 12/2012 | Yasumura et al. | 324/750.03 |
| 2003/0129305 A1 * | 7/2003 | Wu et al. | 427/255.28 |
| 2004/0119021 A1 * | 6/2004 | Parker et al. | 250/396 R |
| 2005/0224722 A1 * | 10/2005 | Demos et al. | 250/492.2 |
| 2006/0114012 A1 * | 6/2006 | Reitinger | 324/760 |
| 2008/0098833 A1 * | 5/2008 | Sasaki et al. | 73/865.9 |
| 2008/0130237 A1 * | 6/2008 | Lee | 361/717 |
| 2008/0157796 A1 * | 7/2008 | Andrews et al. | 324/755 |
| 2008/0212640 A1 * | 9/2008 | Sasaki et al. | 374/100 |
| 2010/0289511 A1 * | 11/2010 | Kiesewetter et al. | 324/750.03 |

\* cited by examiner

EVALUATION DEVICE AND EVALUATION METHOD FOR SUBSTRATE MOUNTING APPARATUS AND EVALUATION SUBSTRATE USED FOR THE SAME

CROSS-REFERENCE TO RELATED APPLICATION

This application claims the benefit of Japanese Patent Application No. 2010-015629 filed on Jan. 27, 2010 and U.S. Provisional Application Ser. No. 61/282,665 filed on Mar. 15, 2010, the entire disclosures of which are incorporated herein by reference.

FIELD OF THE INVENTION

The present disclosure relates to an evaluation device and an evaluation method for a substrate mounting apparatus used for holding a target substrate such as a silicon wafer in a semiconductor manufacturing process and controlling a temperature of the target substrate. More particularly, the present disclosure relates to a device and a method for easily evaluating a function, especially, a temperature control function, of a substrate mounting apparatus when a target substrate is heated from the outside in a plasma process or the like.

BACKGROUND OF THE INVENTION

In a semiconductor manufacture field, there has often been used a plasma processing apparatus which performs an etching process or a film forming process by applying plasma to a target substrate (hereinafter, referred to as "substrate") such as a silicon wafer. Since such a plasma process has been performed under a depressurized pressure, a vacuum chuck cannot be used to hold the substrate. Thus, there has generally been used a substrate mounting apparatus such as a mechanical clamp or an electrostatic chuck using electrostatic force.

The electrostatic chuck may include a substrate mounting surface made of an insulator having therein an embedded sheet electrode. If a high potential is applied to the sheet electrode, Coulomb force or Johnsen-Rahbek force is generated by static electricity distributed in the insulator and polarized and electrified charges in the substrate. Accordingly, the substrate can be held onto the substrate mounting surface by the Coulomb force or the Johnsen-Rahbek force.

A basic function of the electrostatic chuck is to adsorptively hold the substrate, but recently, the electrostatic chuck has generally been used for controlling a temperature of the silicon wafer during a process. By way of example, the electrostatic chuck may be used for cooling the silicon wafer by flowing an inert gas such as helium between the silicon wafer and the electrostatic chuck, or the electrostatic chuck may be used for heating the silicon wafer in combination with a heater. This is because the temperature of the substrate is closely related with a rate of an etching process or a film forming process and a quality of a processing result.

For this reason, in evaluation of the electrostatic chuck, there has been considered the temperature control function of the silicon wafer and uniformity of temperature distribution during a film forming process and an etching process onto the silicon wafer as very important evaluation factors in addition to a mechanical characteristic, a decrease of particles, improvement in purity, plasma resistance, and chemical resistance.

Generally, the temperature of the substrate during a plasma process may depend on heat inputted to the substrate or a mounting table from the outside. Therefore, the temperature control function of the substrate mounting apparatus may be influenced by heat from the outside.

Therefore, performance evaluation for the electrostatic chuck used in the plasma processing apparatus needs to consider heat inputted to the substrate or the mounting table from plasma. If a thermal condition in the performance evaluation is different from a thermal condition in an actual plasma process, results of the performance evaluation may be greatly different from results of the actual plasma process.

If characteristics of the electrostatic chuck are measured by using the plasma processing apparatus under the same condition as a process such as an actual etching process, the performance evaluation can be conducted accurately. However, it costs a lot to use a high-priced and complicated plasma processing apparatus for this evaluation. Further, there is a problem in that it takes a lot of effort and time required for the evaluation.

For this reason, disclosed in Patent Document 1 are an evaluation device and an evaluation method for an electrostatic chuck. In Patent Document 1, performance of an electrostatic chuck is evaluated by providing the electrostatic chuck in an evacuable airtight chamber and heating a substrate by a lamp heater positioned above the electrostatic chuck to simulate a thermal condition in a plasma processing apparatus.

Meanwhile, disclosed in Patent Document 2 are an evaluation device and an evaluation method for simply evaluating a substrate mounting apparatus by simulating a thermal status corresponding to an actual plasma processing apparatus.

Patent Document 1: Japanese Patent Laid-open Publication No. 2006-86301
Patent Document 2: Japanese Patent Laid-open Publication No. 2008-108938

As disclosed in Patent Document 1, the evaluation method for the electrostatic chuck is conducted in the evaluation device which simulates the thermal condition by using the lamp heater (halogen lamp) as an external heating source instead of plasma. Accordingly, the performance for the electrostatic chuck can be simply evaluated.

However, upon review of this method, the present inventor has found that it is difficult to simulate the thermal condition using plasma by the evaluation method for the electrostatic chuck disclosed in Patent Document 1.

The reason for that is a difference in a heat transfer mechanism between heat transfer from plasma and heat transfer from a conventional heating lamp or heater. Generally, it is deemed that the heat transfer from plasma of high temperature is mainly caused by contact heat transfer by molecules excited into plasma.

Meanwhile, the heat transfer from the heating lamp occurs in such a way that resonance absorption of an infrared light irradiated from a heating source occurs on a substrate, and such energy brings about motion (vibration) of molecules, and, thus, friction between vibrated materials generates heat.

Here, the infrared light irradiated from the heating lamp may mainly include a near infrared ray (about 0.78 µm to about 2 µm) and an infrared ray (about 2 µm to about 4 µm). A silicon wafer serving as the substrate mostly transmits the infrared ray (infrared light) of a wavelength in the range of from about 1 µm to about 5 µm. For this reason, the silicon wafer is hardly heated by an infrared lamp, and the infrared light penetrates the silicon wafer and entirely heats a surface (mounting surface) of the electrostatic chuck underneath the silicon wafer.

Here, in a microscopic view, there exist freaks on surfaces of the electrostatic chuck and the silicon wafer. For this reason, contact surfaces between the electrostatic chuck and the silicon wafer have some areas where the surfaces are in close contact with each other and some areas where a gap exists between the surfaces. In this status, the irradiation light (infrared light) from the infrared lamp mostly penetrates the silicon wafer. Accordingly, only the surface of the electrostatic chuck is heated at the areas where the gap exists between the surfaces, whereas the contact surface of the silicon wafer with the electrostatic chuck is heated at the areas where the surfaces are in close contact with each other. Consequently, the heat is sufficiently transferred to the silicon wafer at the areas where the surfaces are in close contact with each other. Meanwhile, the heat is not sufficiently transferred into the silicon wafer at the areas where the gap exists between the surfaces (where the surfaces are not in close contact with each other).

Meanwhile, in an actual process using plasma, it is deemed that heat is mainly transferred by contact heat transfer of molecules when molecules exited into plasma of high temperature when the molecules are brought into contact with the silicon wafer. For this reason, the entire surface of the silicon wafer can be uniformly heated.

Therefore, it is deemed that a thermal status of the electrostatic chuck and the silicon wafer in the simulation device using the infrared light is different from that in the actual plasma processing apparatus.

In order to solve this problem, disclosed in Patent Document 2 is the evaluation device for evaluating the performance of the substrate mounting apparatus by using the infrared heater as the heating source. In this evaluation device, to simulate the thermal status corresponding to the actual plasma processing apparatus, the thermal status of the plasma processing apparatus can be simply simulated by using a substrate made of silicon carbide which absorbs the infrared light instead of a substrate made of silicon.

However, the evaluation device disclosed in Patent Document 2 needs to additionally include the infrared heater or the lamp as the heating source like the evaluation device disclosed in Patent Document 1. For this reason, there is a problem in that the evaluation device becomes larger and expensive.

Further, since the heating source such as the infrared heater is positioned above the substrate, when temperature distribution of an entire substrate is measured by, for example, a non-contact radiation thermometer, the measurement may be influenced by the heating source such as the infrared heater. Meanwhile, it may be possible to use a temperature probe as a thermocouple element, but it is very difficult to arrange temperature probes as thermocouple elements on the entire substrate. If the temperature probes as thermocouple elements are arranged, areas where they are positioned have thermal characteristics that are different from other areas. For this reason, if a multiple number of such areas having thermal characteristics different from the other areas exist on the substrate for evaluation, a thermal status thereof becomes different from an actual thermal status. Accordingly, there is a problem in that performance evaluation of the electrostatic chuck cannot be simply conducted on its entire surface with high precision according to the technologies disclosed in Patent Documents 1 and 2.

Meanwhile, when a temperature control function of an electrostatic chuck serving as a substrate mounting table is evaluated, it is not necessary to uniformly evaluate an entire surface of a substrate mounting surface. According to research by the present inventor until now, it has been found that it is possible to specify some areas which should not be excluded from evaluation of characteristics of the electrostatic chuck. By way of example, there is formed a flow path for coolant used for a temperature control in the electrostatic chuck and the coolant flows into and out from the flow path. For this reason, it is difficult to control temperatures at an inlet and outlet of the coolant flow path as compared to temperatures in the other areas. Further, an area near a high voltage power supply unit where the coolant flow path cannot be formed or an area near lift pins for moving the substrate up and down have the same problem. Furthermore, an outer periphery in a circumferential direction of the substrate has a plasma density distribution problem or electric field distribution problem and needs more delicate temperature control than any other areas.

In the conventional methods, it is possible to measure and evaluate temperature characteristics on the entire surface of the substrate mounting table at a time, but it is very difficult to uniformly heat the entire substrate. Further, it costs a lot to conduct the measurement and evaluation.

With regard to this problem, the present inventor has conceived that a self-heating type evaluation substrate can be used as a dedicated substrate (hereinafter, referred to as "evaluation substrate") to evaluate characteristics of a substrate mounting apparatus such as an electrostatic chuck. According to this, it is possible to evaluate performance of an electrostatic chuck made of, for example, silicon which transmits the infrared light. Further, if the self-heating type evaluation substrate is used, the heating source such as the infrared heater is not needed, and, thus, a non-contact thermometer can be provided thereabove. With this configuration, it is possible to measure temperature distribution of an entire surface of the evaluation substrate with high accuracy. The present inventor has derived the present disclosure in view of the foregoing description.

Accordingly, the present disclosure provides an evaluation device and an evaluation method for a substrate mounting apparatus capable of simply evaluating a temperature control function of the substrate mounting apparatus under preset evaluation conditions or circumstances, and an evaluation substrate used for the same.

BRIEF SUMMARY OF THE INVENTION

In accordance with one aspect of the present disclosure, there is provided an evaluation device for a substrate mounting apparatus which holds a target substrate mounted on a mounting surface and controls a temperature of the target substrate. The evaluation device includes an evacuable airtight chamber in which the substrate mounting apparatus is provided; an evaluation substrate which is mounted on the mounting surface instead of the target substrate and includes a self-heating resistance heater; and a temperature measurement unit which measures a temperature of the evaluation substrate.

In the evaluation device, the resistance heater may be provided within the evaluation substrate and/or on all or a part of a surface of the evaluation substrate.

In the evaluation device, the evaluation substrate may have substantially same size and shape as the target substrate.

In the evaluation device, the evaluation substrate may have an enough size to measure temperatures of measurement target areas on the mounting surface.

In the evaluation device, the temperature measurement unit may be a temperature probe as a thermocouple element.

In the evaluation device, temperature probe as a thermocouple element may be provided in an opening formed in the resistance heater so as to be brought into contact with the evaluation substrate.

In the evaluation device, the temperature measurement unit may be a non-contact thermometer which is not in contact with the evaluation substrate.

In the evaluation device, the resistance heater may have therein an opening through which infrared light of the evaluation substrate radiated.

In the evaluation device, the non-contact thermometer may be provided outside the airtight chamber so as to receive the infrared light via an observation window provided in the airtight chamber.

In the evaluation device, the substrate mounting apparatus may be an electrostatic chuck.

In accordance with another aspect of the present disclosure, there is provided an evaluation substrate used in an evaluation device for a substrate mounting apparatus which holds a target substrate mounted on a mounting surface and controls a temperature of the target substrate. The evaluation substrate includes a resistance heater which increases a temperature of the evaluation substrate to a required level in a substantially uniform manner; and a temperature measurement unit which measures a temperature of the evaluation substrate.

In the evaluation substrate, the evaluation substrate may have substantially same size and shape as the target substrate.

In the evaluation substrate, the evaluation substrate may have an enough size to measure temperatures of measurement target areas on the mounting surface.

In the evaluation substrate, the resistance heater may be provided on all or a part of a surface of the evaluation substrate.

In the evaluation substrate, the temperature measurement unit may be a temperature probe as a thermocouple element.

In the evaluation substrate, the temperature probe as a thermocouple element may be provided in an opening formed in the resistance heater so as to be brought into contact with the evaluation substrate.

In the evaluation substrate, the temperature measurement unit may be a thermometer which is not in contact with the evaluation substrate.

In the evaluation substrate, an opening through which infrared light of the evaluation substrate are radiated may be formed in the resistance heater provided on the evaluation substrate.

In accordance with still another aspect of the present disclosure, there is provided an evaluation method for a substrate mounting apparatus includes providing the substrate mounting apparatus which holds a target substrate mounted on a mounting surface and includes a temperature control unit for controlling a temperature of the target substrate in a depressurizable airtight chamber; mounting an evaluation substrate having a self-heating resistance heater on the substrate mounting apparatus; measuring temperature distribution of the evaluation substrate by adjusting a temperature of the evaluation substrate to a required level by the temperature control unit and the resistance heater; and evaluating a function of the substrate mounting apparatus based on the temperature distribution of the evaluation substrate.

In the evaluation method, the evaluation substrate may be self-heated by the resistance heater provided within the evaluation substrate and/or on all or a part of a surface of the evaluation substrate.

In the evaluation method, the function of the substrate mounting apparatus may be evaluated by using the evaluation substrate having substantially same size and shape as the target substrate.

In the evaluation method, characteristics of measurement target areas on the mounting surface may be evaluated by using the evaluation substrate having an enough size to measure temperatures of the measurement target areas.

In the evaluation method, the temperature distribution of the evaluation substrate may be measured by a temperature probe as a thermocouple element.

In the evaluation method, the temperature probe as a thermocouple element may be provided so as to be brought into contact with the evaluation substrate.

In the evaluation method, the temperature distribution of the evaluation substrate may be measured by a thermometer which is not in contact with the evaluation substrate.

In the evaluation method, an opening may be formed in the resistance heater, and the temperature distribution of the evaluation substrate may be measured by using an opening through which infrared light is radiated from the evaluation substrate.

In the evaluation method, the temperature distribution of the evaluation substrate may be measured via an observation window provided in the airtight chamber by a unit outside the airtight chamber.

In the evaluation method, the substrate mounting apparatus may be an electrostatic chuck.

In accordance with the present disclosure, it is possible to provide an evaluation device and an evaluation method for a substrate mounting apparatus capable of simply evaluating a temperature control function of the substrate mounting apparatus depending on evaluation conditions or circumstances and an evaluation substrate used for the same.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
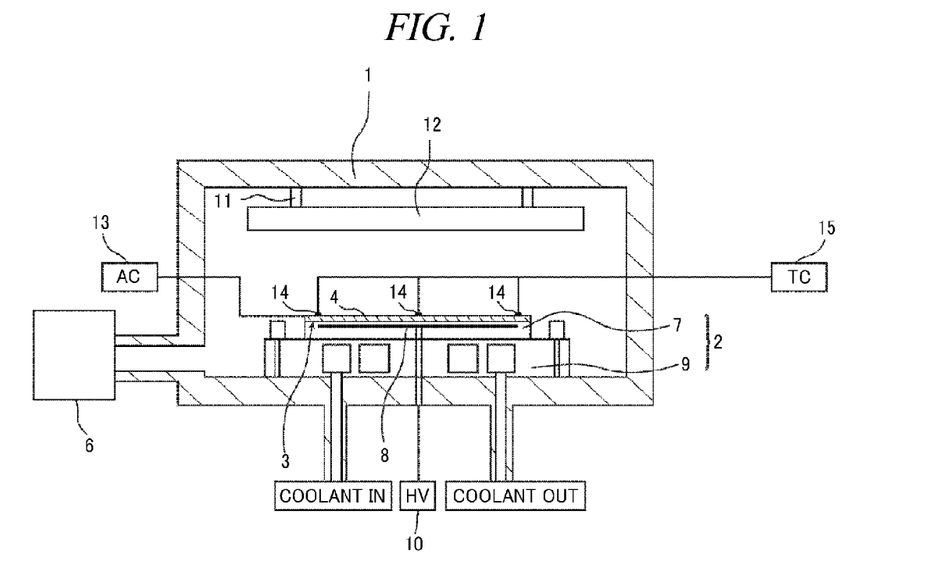
FIG. 1 is a schematic cross-sectional view of an evaluation device for a substrate mounting apparatus in accordance with an embodiment of the present disclosure.

Hereinafter, embodiments of the present disclosure will be described with reference to the accompanying drawings, but the present disclosure is not limited thereto. FIG. 1 is a schematic cross-sectional view of an evaluation device for a substrate mounting apparatus in accordance with an embodiment of the present disclosure. This evaluation device may include an airtight chamber 1; a vacuum pump 6 which evacuates the inside of the chamber 1; an electrostatic chuck 2 provided in the chamber 1; an evaluation substrate 4 mounted on a mounting surface 3 of the electrostatic chuck 2; a self-heating type resistance heater 5 (see FIGS. 2A and 2B) provided on the evaluation substrate 4; an AC power supply 13 which supplies a power to the resistance heater 5; temperature probes 14 as thermocouple elements buried in the evaluation substrate 4; and a thermocouple main body 15 connected thereto.

A type of the electrostatic chuck 2 as an evaluation target in the present disclosure is not specially limited. By way of example, an insulation body 7 may be any one of a ceramic body formed by thermal spraying or sintering or insulating resin body such as a polyimide film. An electrode 8 may be formed into any one of a film shape, a plate shape, and a spiral coil shape as long as a voltage can be applied substantially uniformly onto an entire surface of a target substrate.

The electrostatic chuck 2 may have a configuration in which the electrode 8 is buried in the insulation body 7 constituting the mounting surface 3, and the insulation body 7 is fixed on a cooling plate 9. In the cooling plate 9, a coolant path is formed and coolant flows therein through an inlet line and an outlet line. Further, the electrode 8 is supplied with a high voltage from a DC power supply 10.

Provided at a ceiling of the chamber 1 is a heat insulating plate 12 via an insulating post 11 in order to prevent overheating of the ceiling. Here, the heat insulating plate 12 can be omitted depending on an upper limit of a temperature increased by the resistance heater 5. The resistance heater 5 is supplied with a power from the AC power supply 13 outside the chamber 1, so that the evaluation substrate 4 is self-heated. The power is controlled by a controller (not shown) to an appropriate value.

Further, desirably, the cooling plate 9 and the insulation body 7 may adhere to each other as one body in order to improve heat conductivity and the cooling plate 9 may be made of a material of high heat conductivity.

Meanwhile, a cooling medium such as a He gas can be introduced between the evaluation substrate 4 and the insulation body 7 in order to directly cool the evaluation substrate. Alternatively, a heater may be provided in the cooling plate 9 and the cooling plate 9 may be used as not a heat sink but a heat source.

Desirably, by evacuating the inside of the camber 1 by the vacuum pump, the chamber 1 may have a vacuum level lower than several Torr, and specifically equal to a vacuum level of various kinds of plasma processing apparatuses. However, any vacuum level is possible as long as the evaluation substrate 4 is maintained in a thermally isolated state from its surroundings. If air flow and convection do not occur, the chamber 1 may be in the atmospheric atmosphere.

Herein, a feature of the prevent disclosure is that the resistance heater 5 (see FIGS. 2A and 2B) is provided on the evaluation substrate 4. Since the resistance heater 5 is provided on the evaluation substrate 4, heat can be transferred directly to the evaluation substrate 4. For this reason, a material, which is not heated due to transmission of infrared lights from an infrared lamp or an infrared heater, can be heated. Further, since the evaluation substrate 4 is self-heated, an external heating source such as an infrared heater or a lamp is unnecessary.

Hereinafter, there will be explained a size of the evaluation substrate 4 including the resistance heater 5. The present inventor found out that when performance evaluation for the electrostatic chuck 2 is conducted, temperature distribution on its entire surface needs not be measured at a time. That is because it is possible to specify areas to be measured after evaluation of a temperature control function of the electrostatic chuck 2 is completed. By way of example, areas corresponding to an inlet and an outlet of the coolant path or a high voltage power supply unit, areas near lift pins, and an outer periphery of the target substrate in a circumferential direction thereof are important places for the evaluation.

In view of the foregoing, desirably, the evaluation substrate 4 may be large enough such that temperatures can be measured at areas to be evaluated, and such an evaluation substrate 4 will be referred to as "chip-type evaluation substrate" herein. It is easy to uniformly heat the entire chip-type evaluation substrate 4 including the resistance heater 5. Depending on an arrangement of the resistance heater 5, the evaluation substrate 4 may have the same size and shape as an actual target substrate such as a silicon wafer of about 300φ.

Hereinafter, there will be explained a principle of measurement of a heat flow rate by using the evaluation substrate 4 of the present disclosure. The evaluation substrate 4 is maintained in a thermally isolated state from the outside. By way of example, the vacuum chamber 1 may have a vacuum level in the range of from about 1 Pa to about 100 Pa and a current may flow into the resistance heater 5. A power applied to the resistance heater 5 may be in the range of from about 1 kW/m$^2$ to about 100 kW/m$^2$, and, desirably, in the range of from about 20 kW/m$^2$ to about 40 kW/m$^2$. By way of example, if a silicon evaluation substrate having a size of about 300φ heated from the normal temperature to about 100°C., it is desirable to apply a power in the range of from about 2 kW to about 4 kW.

In this case, if the applied voltage is about 100 V, resistance is in the range of from about 2Ω to about 5Ω, and if the applied voltage is about 200 V, resistance is in the range of from about 10Ω to about 20Ω. When such a power is applied to the resistance heater 5, an hourly change in temperature of the evaluation substrate 4 is set as a reference temperature characteristic.

Subsequently, the evaluation substrate 4 is mounted on the electrostatic chuck 2, the same power is applied to the resistance heater 5, and a temperature of the evaluation substrate 4 which is temperature-controlled by the electrostatic chuck 2 is measured every hour. This is the same as a measurement of a heat loss (calories lost by the evaluation substrate 4) at a contact area between the electrostatic chuck 2 and the evaluation substrate 4. Further, by comparing the measured heat loss value with a theoretical heat loss value, a function of the electrostatic chuck 2 is evaluated.

Herein, the temperature of the evaluation substrate 4 can be measured directly by, for example, the temperature probe 14 as a thermocouple element. Alternatively, the temperature of the evaluation substrate 4 can be measured by, for example, a radiation thermometer as a non-contact temperature measuring device. Hereinafter, there will be explained each temperature measuring method in case of using the chip-type evaluation substrate 4 and in case of using the evaluation substrate having the same size and shape as the target substrate.

Figure 2A:
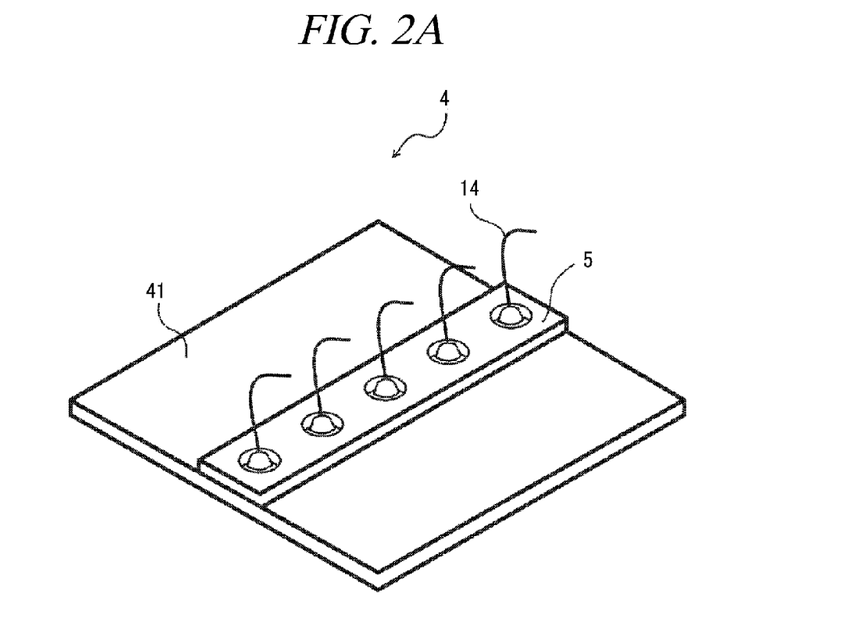
FIGS. 2A and 2B show a chip-type evaluation substrate in accordance with an embodiment of the present disclosure.
Figure 2B:
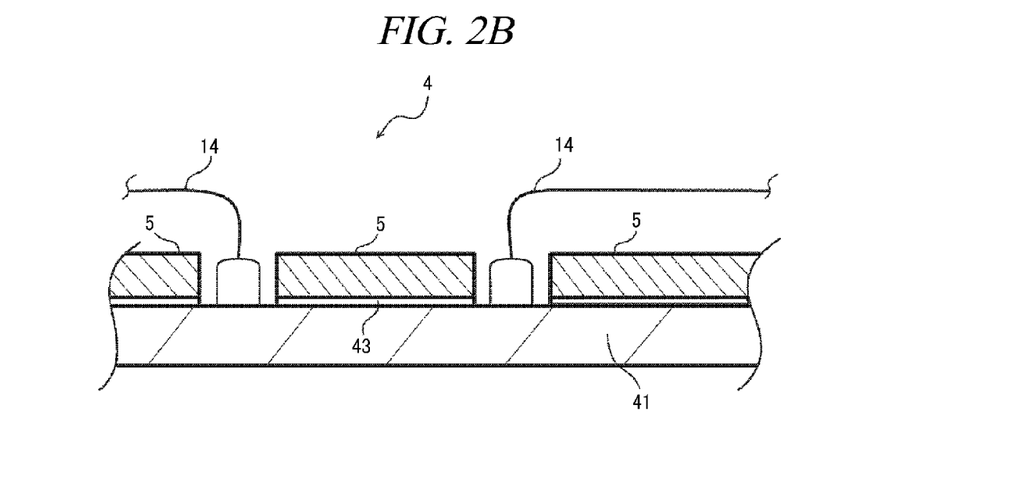

FIGS. 2A and 2B show the chip-type evaluation substrate 4 in accordance with an embodiment of the present disclosure. The evaluation substrate 4 may evaluate characteristics of the electrostatic chuck 2 at each area. FIG. 2A is a perspective view of the evaluation substrate 4, and FIG. 2B is a cross-sectional view thereof. As depicted in FIGS. 2A and 2B, the resistance heater 5 is provided on a surface of the evaluation substrate 4 via an adhesion layer such as an adhesive. Alternatively, the resistance heater 5 may be provided on the evaluation substrate 4 by heat-pressing adhesion, vapor deposition, thermal spraying, coating, and printing other than by using the adhesive.

Herein, it is illustrated that the resistance heater is provided on the surface, i.e., a base 41, of the evaluation substrate 4, but the resistance heater 5 may be provided within the base 41. By way of example, the resistance heater 5 may be embedded in the base 41. Further, the resistance heater 5 may be buried when the evaluation substrate 4 is fabricated.

A material of the resistance heater 5 is not specifically limited, but in general, any material such as a metal heating wire, graphite, or conductive ceramic can be used as long as it generates heat when a current flows. Further, any shape or any arrangement of the resistance heater 5 is possible as long as the entire evaluation substrate 4 can be uniformly heated.

As depicted in FIGS. 2A and 2B, a plurality of the temperature probes 14 as thermocouple elements is connected to the resistance heater 5. An electromotive power from the temperature probes 14 as thermocouple elements is transmitted to the external thermocouple main body 15 via a connection terminal provided at an inner wall of the chamber 1, and, thus, a temperature of the evaluation substrate 4 is measured.

Front ends of the temperature probes 14 as thermocouple elements are closely connected and fixed to the evaluation substrate 4 by an adhesive or the like. It is important that a total amount of the adhesive covering the front ends is uniform and there is no gap in a contact interface and also, air bubbles are not entered therein.

Figure 3A:
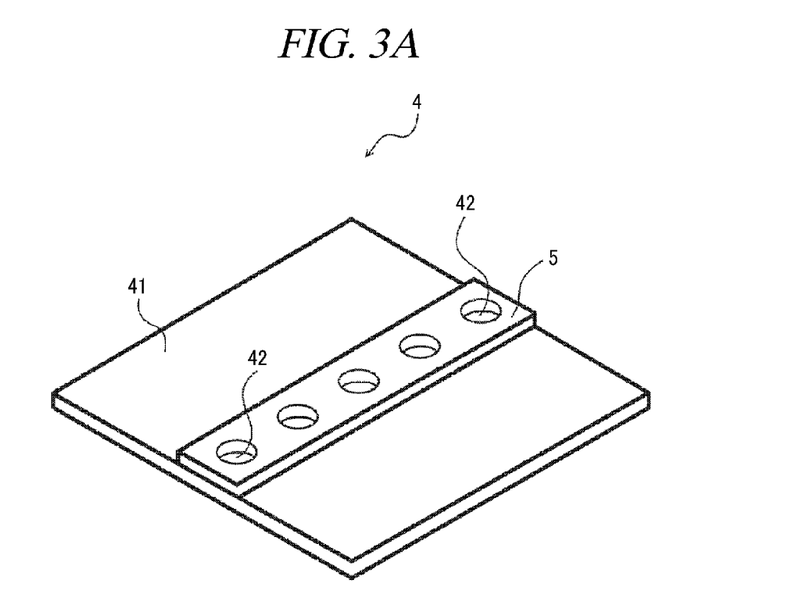
FIGS. 3A and 3B show a chip-type evaluation substrate in accordance with an embodiment of the present disclosure.
Figure 3B:
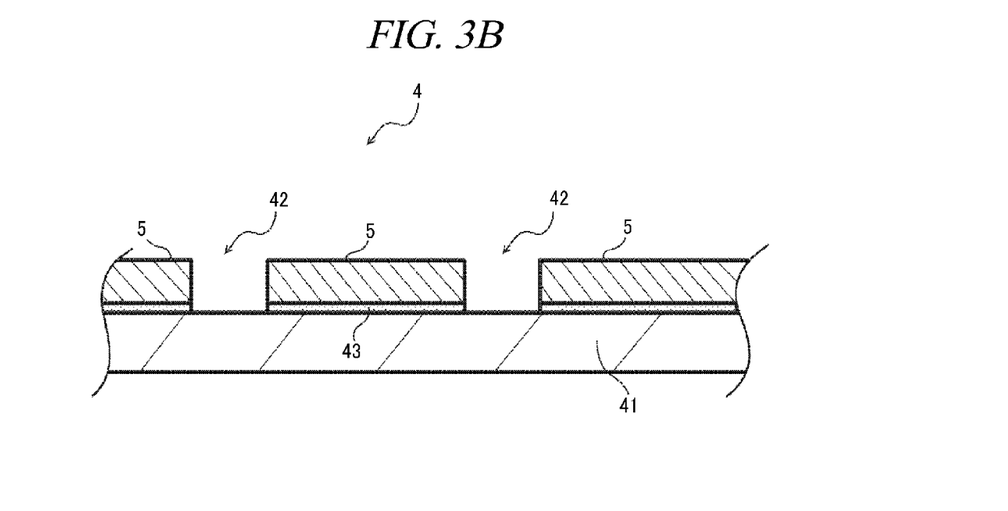

A temperature of the evaluation substrate 4 may be measured by a non-contact thermometer such as a radiation thermometer instead of the temperature probes 14 as thermocouple elements. FIGS. 3A and 3B show the chip-type evaluation substrate 4 in accordance with an embodiment of the present disclosure. As depicted in FIGS. 3A and 3B, the temperature probes 14 as thermocouple elements in the resistance heater 5 of the evaluation substrate 4 illustrated in FIGS. 2A and 2B are removed. A surface of the base 41 can be seen through openings 42 to which the temperature probes 14 as thermocouple elements were attached.

With this configuration, it is possible to measure infrared light radiated through the openings 42 of the resistance heater 5 and the temperature of the evaluation substrate 4 can be measured by measuring the infrared light.

Hereinafter, there will be explained a temperature measurement method of the evaluation substrate 4 using a radiation thermometer. As described above, various materials may be considered for a material of the evaluation substrate 4. In this case, emissivity may be varied depending on a material of the evaluation substrate 4 and a displayed temperature of the radiation thermometer may be affected accordingly. Therefore, for example, a thermostat furnace may be used and a difference between a temperature of the thermostat furnace (i.e., a temperature of the evaluation substrate 4) and the displayed temperature of the radiation thermometer may be corrected in advance. By making such a correction in advance, a temperature of the evaluation substrate 4 can be measured with high accuracy regardless of a material of the evaluation substrate 4.

Figure 4:
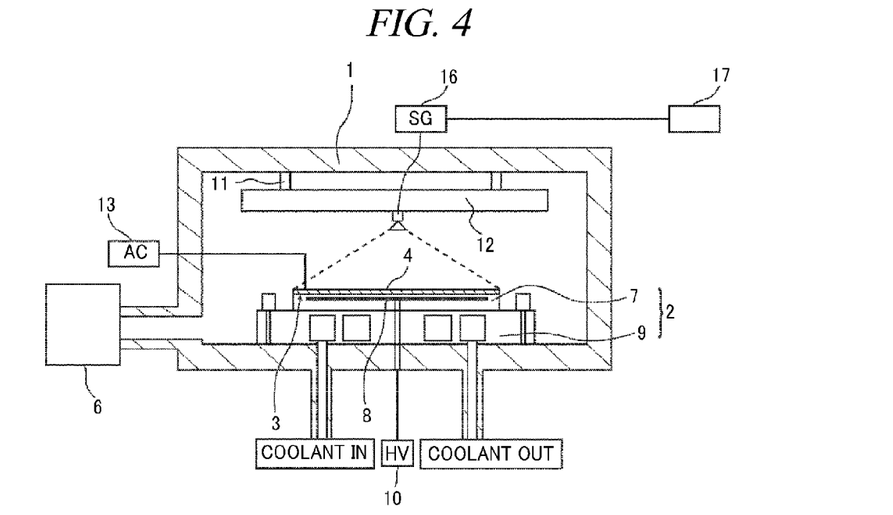
FIG. 4 shows an evaluation device for a substrate mounting apparatus in case of measuring a temperature of an evaluation substrate by a radiation thermometer.

FIG. 4 shows an evaluation device for a substrate mounting apparatus in case that a temperature of the evaluation substrate 4 is measured by a radiation thermometer. As depicted in FIG. 4, the radiation thermometer 16 may be provided in the airtight chamber 1.

In the evaluation device depicted in FIG. 4, the radiation thermometer 16 is provided at the heat insulating plate 12 via the insulating post 11 in the airtight chamber 1 in order to prevent overheating of the ceiling. With this radiation thermometer 16, it is possible to measure a temperature by using infrared light radiated from the openings 42 of the evaluation substrate 4. Further, in the present embodiment, temperature distribution of the entire surface of the evaluation substrate 4 is measured by a single radiation thermometer 16. However, the present disclosure is not limited thereto, and, by way of example, another radiation thermometer 16 may be further provided in order to measure a temperature of the outer periphery of the evaluation substrate 4.

Figure 5:
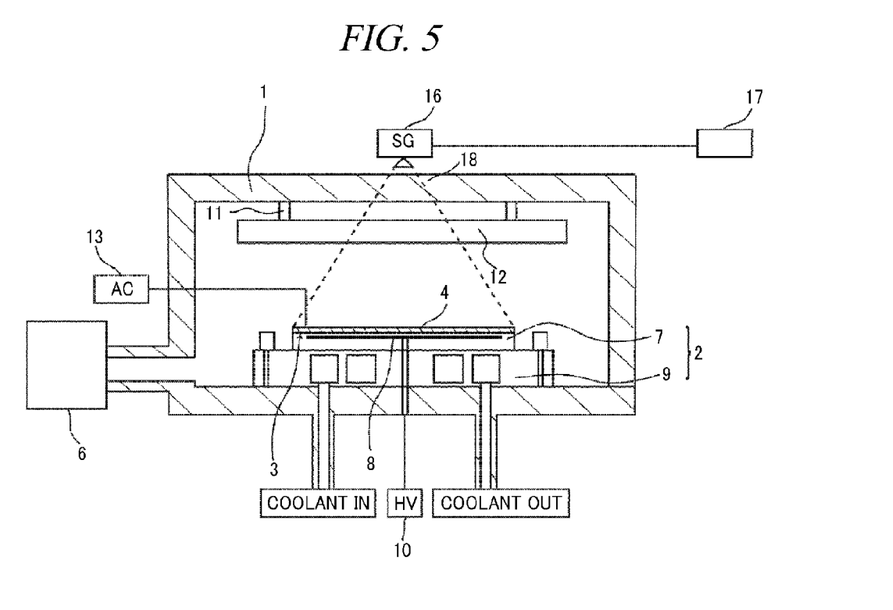
FIG. 5 shows an evaluation device for a substrate mounting apparatus in case of measuring a temperature of an evaluation substrate by a radiation thermometer.

FIG. 5 illustrates an evaluation device in which the radiation thermometer 16 is provided outside the airtight chamber 1. When the radiation thermometer 16 is provided outside the airtight chamber 1, an observation window 18 may be provided at an upper part of the chamber 1 and a hole may be formed at a position corresponding to the observation window 18 in the heat insulating plate 12. With this observation window 18, it is possible to measure the infrared light radiated through the openings 42 of the evaluation substrate 4, and, thus, a temperature of the evaluation substrate 4 can be measured. Since the radiation thermometer 16 is provided outside the airtight chamber 1, a design of the evaluation device becomes easier.

Figure 6:
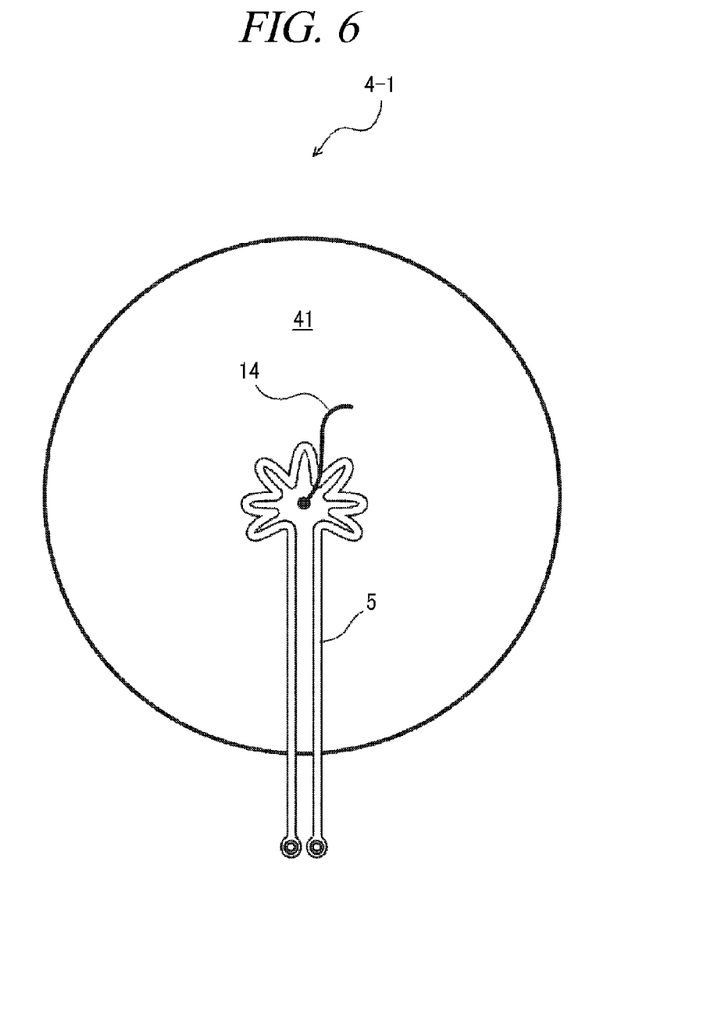
FIG. 6 is a plane view of an evaluation substrate in which a resistance heater is positioned so as to surround a temperature probe as a thermocouple element.

Hereinafter, there will be explained the evaluation substrate 4 having the same size and shape as the target substrate. FIG. 6 is a plane view of an evaluation substrate 4-1, and the evaluation substrate 4-1 may include a base 41 as a silicon wafer which is used in an actual plasma process; a temperature probe 14 as a thermocouple element embedded in a central portion of the base 41; and a resistance heater 5 positioned so as to surround the temperature probe 14 as a thermocouple element.

As described above, a power supply unit for supplying a high voltage to the electrode 8 is positioned at a central area of the electrostatic chuck 2, and, thus, a coolant path cannot be formed. For this reason, evaluation of a temperature at the central area is very important and the evaluation substrate 4-1 is used therefor.

Figure 7:
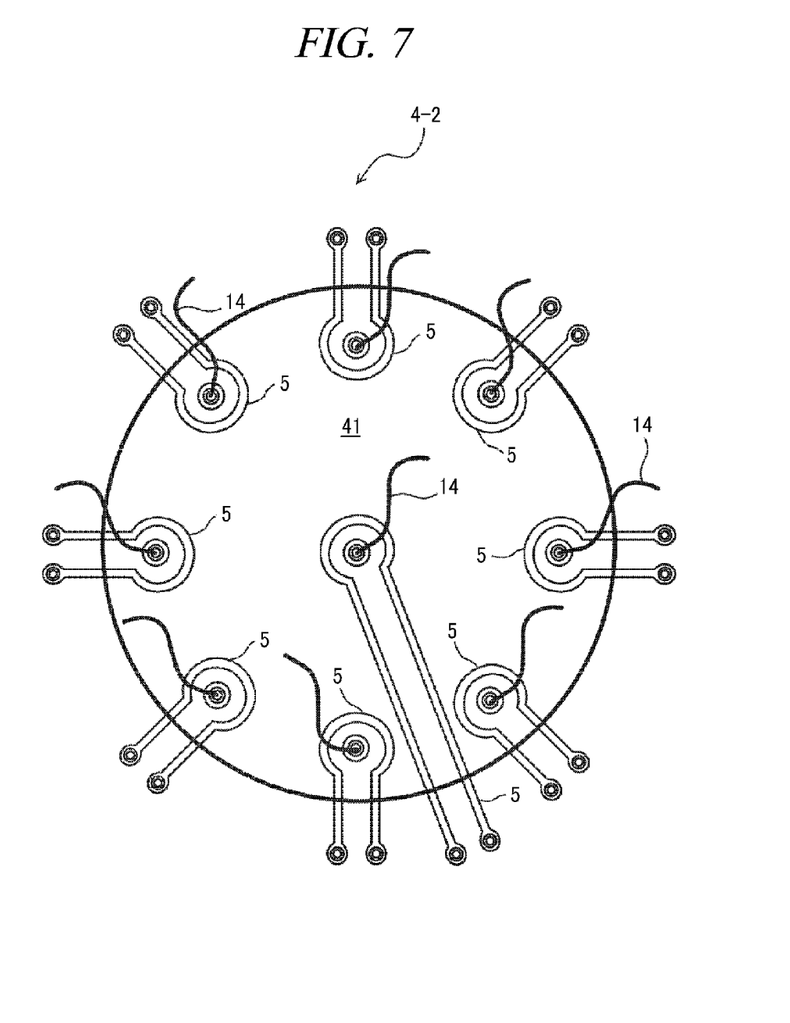
FIG. 7 is a plane view of an evaluation substrate in which temperature probes as thermocouple elements are provided inside clip-shaped resistance heaters.

FIG. 7 is a plane view of an evaluation substrate 4-2, and the evaluation substrate 4-2 may include a base 41 as a silicon wafer; clip-shaped resistance heating bodies 5 provided at eight (8) areas on the outer periphery in the circumferential direction; and temperature probes 14 as thermocouple elements provided in the resistance heating bodies 5. As described above, during a plasma process, the outer periphery of the wafer in the circumferential direction has a problem with non-uniformity in plasma density distribution or electric field distribution. For this reason, the outer periphery is a very important area in evaluation of functions of the electrostatic chuck 2. Accordingly, with the evaluation substrate 4-2, it is possible to evaluate the outer periphery of the wafer in the circumferential direction as well as the central area thereof.

Figure 8:
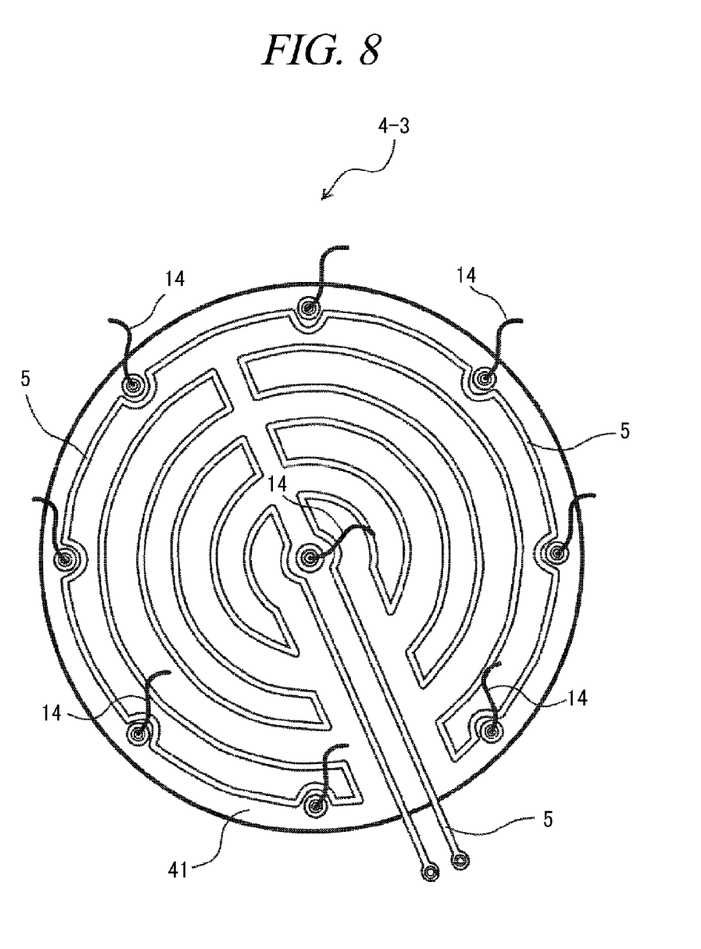
FIG. 8 is a plane view of an evaluation substrate in accordance with another embodiment of the present disclosure, and the evaluation substrate is capable of evaluating an outer periphery of a wafer in a circumferential direction thereof.

FIG. 8 is a modification example of FIG. 7 and shows a plane view of an evaluation substrate 4-3 in accordance with another embodiment of the present disclosure. The evaluation substrate 4-3 can measure a temperature of the central area and the circumferential periphery of the wafer. In the evaluation substrate 4-2 illustrated in FIG. 7, the areas surrounded by the resistance heating bodies 5 are heated and temperatures of the areas are measured by the temperature probes 14 as thermocouple elements, whereas in the evaluation substrate 4-3 illustrated in FIG. 8, temperatures of the outer periphery in the circumferential direction and the central area can be measured while the entire wafer is uniformly heated.

Figure 9:
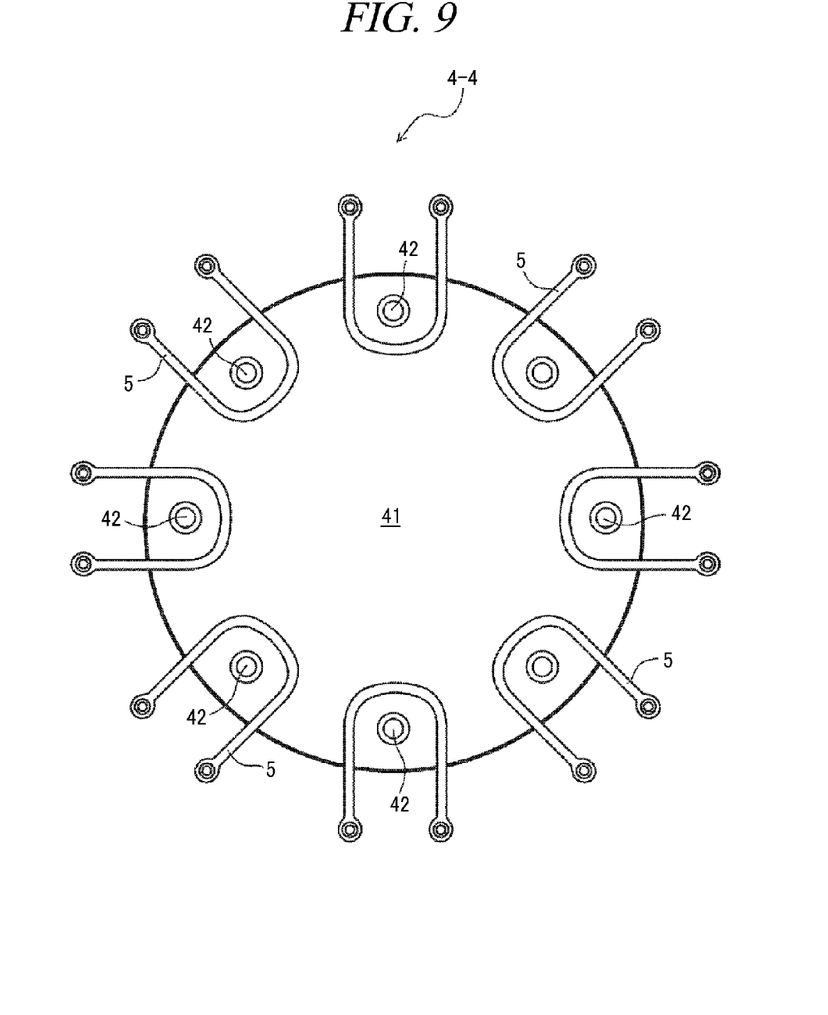
FIG. 9 is a plane view of an evaluation substrate in which openings are formed inside the clip-shaped resistance heaters.

Hereinafter, there will be explained a case where a temperature of the evaluation substrate 4 is measured by using the radiation thermometer 16. FIG. 9 is a plane view of an evaluation substrate 4-4, and the evaluation substrate 4-4 may include a base 41 as a silicon wafer; clip-shaped resistance heating bodies 5 provided at eight (8) areas in the outer periphery in the circumferential direction; and openings 42 provided in the resistance heating bodies 5. By measuring infrared light radiated through the openings 42 by the radiation thermometer 16, a temperature of the outer periphery of the evaluation substrate 4 in the circumferential direction can be measured.

Figure 10:
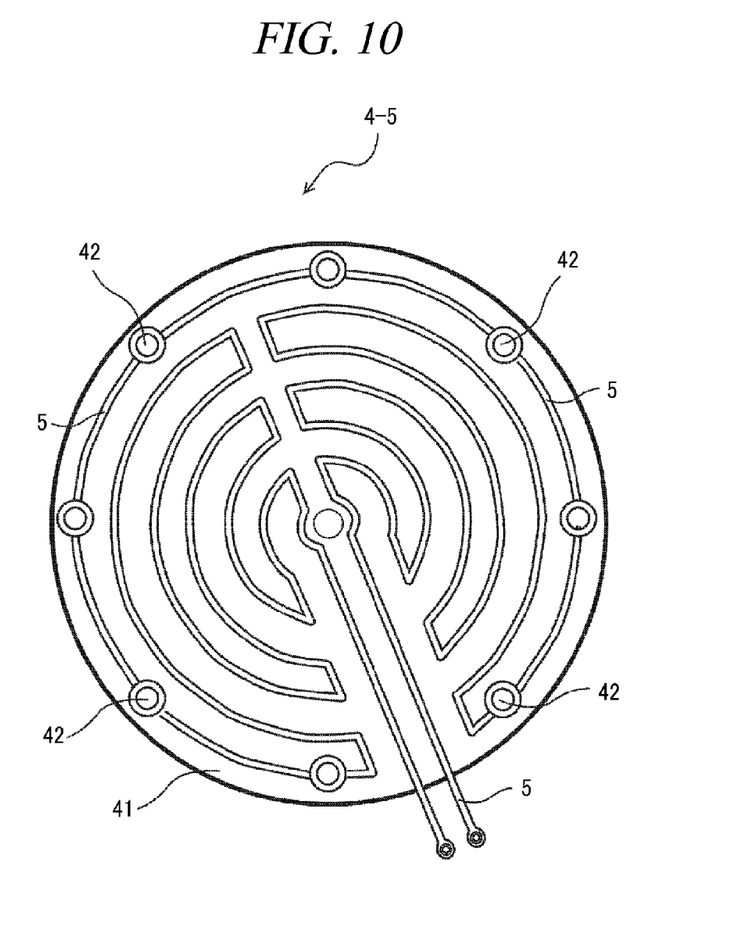
FIG. 10 is a plane view of an evaluation substrate in which temperature probes as thermocouple elements are removed and openings are formed.

FIG. 10 is a plane view of an evaluation substrate 4-5 in which temperature probes 14 as thermocouple elements provided in the evaluation substrate 4-3 shown in FIG. 8 are removed and the openings 42 are opened. By measuring infrared light radiated through the openings 42 by the radiation thermometer 16, temperatures of the outer periphery in the circumferential direction and the central area in the evaluation substrate 4 can be measured.

Figure 11:
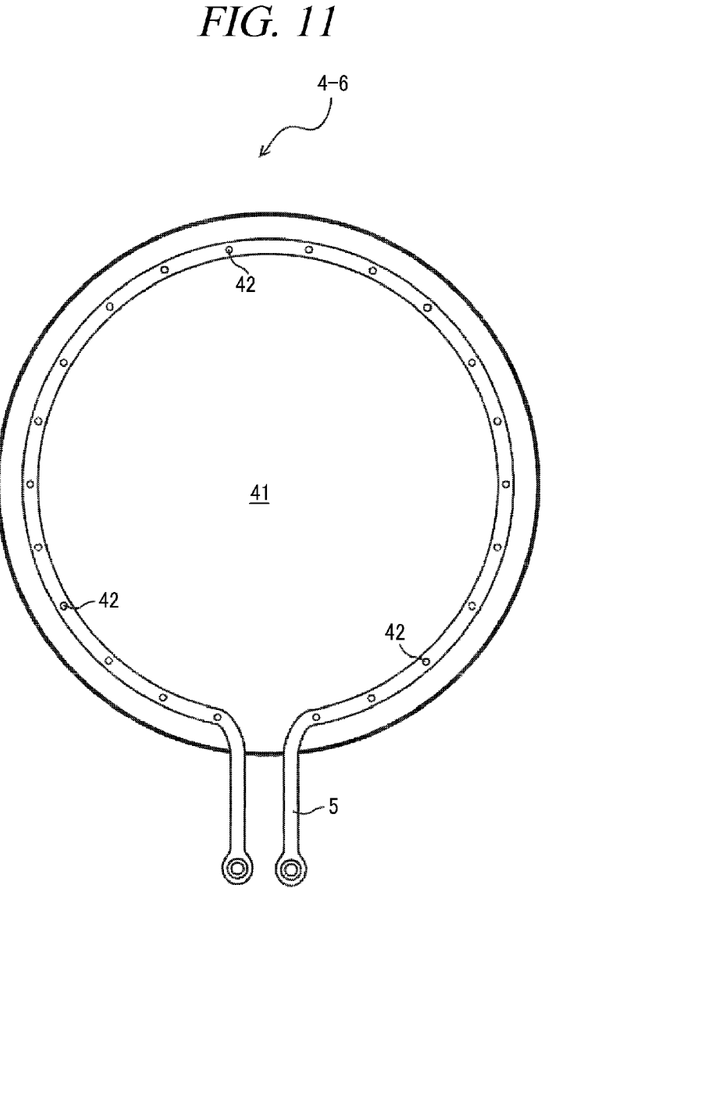
FIG. 11 is a plane view of an evaluation substrate in which a ring-shaped resistance heater is provided at an outer periphery in a circumferential direction and a plurality of openings is formed in the resistance heater.
Figure 12:
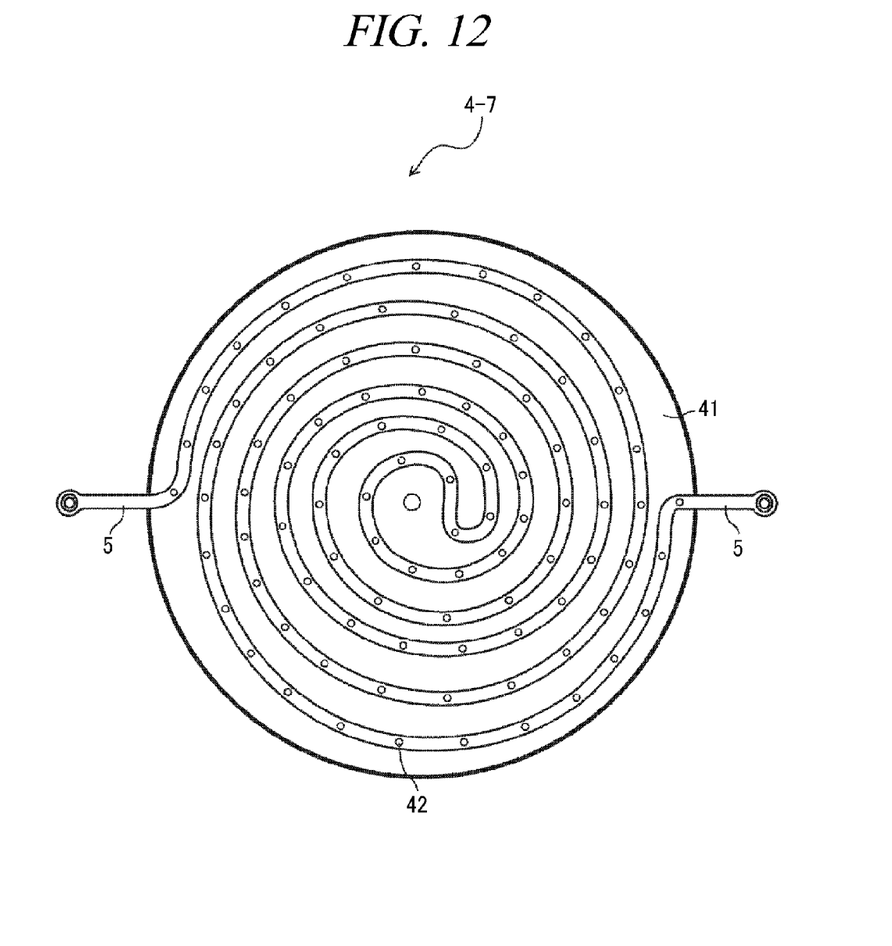
FIG. 12 is a plane view of an evaluation substrate in which a spiral-shaped resistance heater is provided and a plurality of openings is formed in the resistance heater.

FIG. 11 is a plane view of an evaluation substrate 4-6, and the evaluation substrate 4-6 may include a base 41 as a silicon wafer; a ring-shaped resistance heater 5 provided in the outer periphery in its circumferential direction; and a plurality of the openings 42 formed in the resistance heater 5. Further, FIG. 12 is a plane view of an evaluation substrate 4-7, and the evaluation substrate 4-7 may include a base 41 as a silicon wafer; a spiral-shaped resistance heater 5 provided in order to uniformly heat the entire base 41; and a plurality of the openings 42 formed in the resistance heater 5. With the evaluation substrate 4-6, a temperature of the outer periphery in the circumferential direction can be measured by measuring infrared light radiated through the openings 42. Furthermore, with the evaluation substrate 4-7, temperature distribution of the entire wafer can be measured.

What is claimed is:

1. An evaluation device for a substrate mounting apparatus, the device comprising:
    an evacuable airtight chamber in which the substrate mounting apparatus is provided;
    an evaluation substrate which is mounted on a mounting surface and includes a self-heating resistance heating body, the resistance heating body being provided on a surface of the evaluation substrate or being provided within the evaluation substrate; and
    a temperature measurement unit which measures a temperature of the evaluation substrate,
    wherein the resistance heating body has therein at least one opening through which infrared light for measurement of a temperature of the evaluation substrate is radiated, and
    the at least one opening is formed to penetrate the resistance heating body, so that the at least one opening has a cylindrical shape enclosed by the resistance heating body.

2. The evaluation device for the substrate mounting apparatus of claim 1,
    wherein the evaluation substrate has substantially same size and shape as an actual target substrate to be mounted on the substrate mounting apparatus.

3. The evaluation device for the substrate mounting apparatus of claim 1,
    wherein the evaluation substrate has an enough size to measure temperatures of measurement target areas on the mounting surface.

4. The evaluation device for the substrate mounting apparatus of claim 1,
    wherein the temperature measurement unit is a non-contact thermometer which is not in contact with the evaluation substrate.

5. The evaluation device for the substrate mounting apparatus of claim 4,
    wherein the non-contact thermometer is provided outside the airtight chamber so as to receive the infrared light via an observation window provided in the airtight chamber.

6. The evaluation device for the substrate mounting apparatus of claim 1,
    wherein the substrate mounting apparatus is an electrostatic chuck.

7. An evaluation substrate used in an evaluation device for a substrate mounting apparatus, the evaluation substrate comprising:
    a resistance heating body which increases a temperature of the evaluation substrate to a predetermined level in a substantially uniform manner, the resistance heating body being provided on a surface of the evaluation substrate or being provided within the evaluation substrate; and
    a temperature measurement unit which measures a temperature of the evaluation substrate,
    wherein the resistance heating body has therein at least one opening through which infrared light for measurement of a temperature of the evaluation substrate is radiated, and
    the at least one opening is formed to penetrate the resistance heating body, so that the at least one opening has a cylindrical shape enclosed by the resistance heating body.

8. The evaluation substrate of claim 7,
    wherein the evaluation substrate has substantially same size and shape as an actual target substrate to be mounted on the substrate mounting apparatus.

9. The evaluation substrate of claim 7,
    wherein the evaluation substrate has an enough size to measure temperatures of measurement target areas on a mounting surface of the substrate mounting apparatus.

10. The evaluation substrate of claim 7,
    wherein the temperature measurement unit is a thermometer which is not in contact with the evaluation substrate.

11. An evaluation method for a substrate mounting apparatus, the method comprising:
    mounting an evaluation substrate having a self-heating resistance heating body on a mounting surface of the substrate mounting apparatus, the resistance heating body being provided on a surface of the evaluation substrate or being provided within the evaluation substrate;
    adjusting a temperature of the evaluation substrate to a predetermined level by the resistance heating body;
    measuring temperature distribution of the evaluation substrate; and
    evaluating a function of the substrate mounting apparatus based on the temperature distribution of the evaluation substrate, wherein the resistance heating body has therein at least one opening through which infrared light for measurement of a temperature of the evaluation substrate is radiated, and the at least one opening is formed to penetrate the resistance heating body, so that the at least one opening has a cylindrical shape enclosed by the resistance heating body.

12. The evaluation method for the substrate mounting apparatus of claim 11, wherein the function of the substrate mounting apparatus is evaluated by using the evaluation substrate having substantially same size and shape as an actual target substrate to be mounted on the substrate mounting apparatus.

13. The evaluation method for the substrate mounting apparatus of claim 11, wherein characteristics of measurement target areas on the mounting surface are evaluated by using the evaluation substrate having an enough size to measure temperatures of the measurement target areas.

14. The evaluation method for the substrate mounting apparatus of claim 11, wherein the temperature distribution of the evaluation substrate is measured by a thermometer which is not in contact with the evaluation substrate.

15. The evaluation method for the substrate mounting apparatus of claim 14, wherein the temperature distribution of the evaluation substrate is measured via an observation window provided in an airtight chamber by a unit outside the airtight chamber.

16. The evaluation method for the substrate mounting apparatus of claim 11, wherein the substrate mounting apparatus is an electrostatic chuck.

* * * * *